(12) United States Patent
Senoo

(10) Patent No.: US 8,364,073 B2
(45) Date of Patent: Jan. 29, 2013

(54) RADIO RECEIVER

(75) Inventor: Takashi Senoo, Tokyo (JP)

(73) Assignee: Mitsubishi Electric Corp., Tokyo (JP)

( * ) Notice: Subject to any disclaimer, the term of this patent is extended or adjusted under 35 U.S.C. 154(b) by 0 days.

(21) Appl. No.: 13/375,777

(22) PCT Filed: Aug. 28, 2009

(86) PCT No.: PCT/JP2009/004187
§ 371 (c)(1),
(2), (4) Date: Dec. 2, 2011

(87) PCT Pub. No.: WO2011/024227
PCT Pub. Date: Mar. 3, 2011

(65) Prior Publication Data
US 2012/0122413 A1    May 17, 2012

(51) Int. Cl.
H04H 60/09    (2008.01)
H04B 1/18     (2006.01)
(52) U.S. Cl. .................. 455/3.04; 455/161.3; 455/205
(58) Field of Classification Search .............. 455/3.01, 455/3.03, 3.04, 3.06, 161.1, 161.2, 161.3, 455/226.1, 226.2, 205, 211
See application file for complete search history.

(56) References Cited

U.S. PATENT DOCUMENTS

2005/0232431 A1* 10/2005 Kato ............................ 381/2
2006/0229750 A1* 10/2006 Rozier ......................... 700/94

FOREIGN PATENT DOCUMENTS

| EP | 0 938 199 A2 | 8/1999 |
|---|---|---|
| EP | 1 162 836 A2 | 12/2001 |
| JP | 8-222999 A | 8/1996 |
| JP | 11-68519 A | 3/1999 |
| JP | 11-234092 A | 8/1999 |
| JP | 2001-333347 A | 11/2001 |
| JP | 2004-266658 A | 9/2004 |
| JP | 2005-5848 A | 1/2005 |
| JP | 2007-259403 A | 10/2007 |
| JP | 2008-227901 A | 9/2008 |
| JP | 2009-141468 A | 6/2009 |

* cited by examiner

Primary Examiner — Nguyen Vo
(74) Attorney, Agent, or Firm — Birch, Stewart, Kolasch & Birch, LLP

(57) ABSTRACT

A radio receiver receives a broadcast signal and generates an RF signal, generates an IF signal from the RF signal, detects the electric field intensity and the frequency of the IF signal, detects the IF signal and generates a detected signal, detects the intensity of a noise signal that is a harmonic component of a digital signal that exists in a certain specific frequency band from among the detected signals, determines that the broadcast signal includes a desired analog broadcast signal when the electric field intensity of the IF signal is equal to or larger than a predetermined electric field intensity, the frequency is within a predetermined frequency range, and also the signal intensity detected by the noise signal detection unit is equal to or smaller than a predetermined value, and then performs a control to stop a search.

2 Claims, 5 Drawing Sheets

RADIO RECEIVER

TECHNICAL FIELD

The present invention relates to a radio receiver adapted to receive a digital audio broadcast, and more particularly to a technique that can be used to optimize a station search operation (to be referred to hereafter as a "search") in a receiver of a radio that performs digital audio broadcasting using an analog radio frequency band such as an existing FM broadcast and in an analog FM radio receiver.

BACKGROUND ART

In recent years, digitization even in a radio broadcast has been advanced, and HD (High Definition) radio has been proposed as a type of terrestrial digital radio broadcasting.

A great advantage of the HD radio is as follows: when IBOC (In Band On Channel) to add a digital broadcast signal to an analog radio wave of an existing FM broadcast is employed, an identical broadcast can be received by a conventional analog type radio receiver and also a digital broadcast can be received by an HD radio receiver adapted to digital reception. In this manner, when an AM broadcast is received digitally, sound quality on a par with an FM broadcast is obtained, and when an FM broadcast is received digitally, sound quality on a par with a CD is obtained.

Further, as a basic function of HD radio, a digitally received signal is output in an area where digital reception is possible, and a signal received in analog form is output automatically in an area where a digital signal cannot be received to prevent sound interruption or the like. More specifically, during a search, the radio receiver is tuned to a frequency at which an analog broadcast wave can be received, and an analog output wave is initially demodulated. Meanwhile, a determination is made as to whether or not a digital modulated wave (in other words, an IBOC broadcast wave) exists in the analog broadcast wave, and when a digital modulated wave exists, the IBOC broadcast wave is demodulated. Further, by way of a processing called "blending", the demodulated analog broadcast wave is switched to the IBOC broadcast wave, and the IBOC broadcast wave is output. When no digital modulated wave exists, on the other hand, the demodulated analog broadcast wave is output as is.

In a conventional radio receiver, an electric field intensity of an IF signal is detected by an electric field intensity detector, a frequency of the IF signal is detected by an IF counter, and a search for an analog broadcast signal is performed by determining whether or not a desired analog broadcast signal is being received on the basis of the detected electric field intensity and frequency.

PRIOR ART DOCUMENTS

Patent Documents

Patent Document 1: Japanese Patent Application Publication No. H08-222999

SUMMARY OF THE INVENTION

Problems to be Solved by the Invention

In a conventional radio receiver, the electric field intensity of the IF signal is detected by an S meter detector, the frequency of the IF signal is detected by an IF counter detector, and the search for the analog broadcast signal is performed by determining whether or not the desired analog broadcast signal is being received on the basis of the electric field intensity detected by the S meter detector and the frequency detected by the IF counter detector. In an HD radio broadcast, however, a digital broadcast signal exists in a band extending from −198.402 to −129.361 kHz (center: −150.0 kHz) and from 129.361 to 198.402 kHz (center: +150 kHz) relative to a center frequency at which the analog broadcast signal exists, and therefore, when the center frequency varies slightly, a signal having a sufficient electric field intensity and having an IF count value within a predetermined range exists in a frequency band (±200 kHz) to the front and rear thereof; thus, there is a problem such that the digital broadcast signal is erroneously recognized as the desired analog broadcast signal, and the search is stopped mistakenly.

The present invention has been made in view of the above, and an object thereof is to provide a radio receiver that can prevent an erroneous stoppage of a search caused by a digital broadcast signal in an HD radio broadcast.

Means for Solving the Problems

A radio receiver of the present invention receives a broadcast signal and generates an RF signal, generates an IF signal from the RF signal, detects the electric field intensity and the frequency of the IF signal, detects the IF signal and generates a detected signal, detects the intensity of a noise signal that is a harmonic component of a digital signal that exists in a certain specific frequency band from among the detected signals, determines that the broadcast signal includes a desired analog broadcast signal when the electric field intensity of the IF signal is equal to or larger than a predetermined electric field intensity, the frequency is within a predetermined frequency range, and the signal intensity detected by the noise signal detection unit is equal to or smaller than a predetermined value, and then performs a control to stop a search.

Effects of the Invention

An analog broadcast signal and a digital broadcast signal exist in different frequency bands within a broadcast signal for HD radio. Further, a digital signal and a noise signal that is a harmonic component of the digital signal exist in a detected signal of the digital broadcast signal. The noise signal that is the harmonic component of the digital signal exists at a high level in a certain specific frequency band. Therefore, when the noise signal that is the harmonic component of the digital signal existing in the certain specific frequency band in the detected signal of the broadcast signal is detected, the presence of the digital broadcast signal is determined in the case where the noise signal exceeds a certain fixed value, and the corresponding signal can be eliminated from stopping subjects of the search; as a result, an erroneous stoppage in a digital broadcast band can be prevented.

BEST MODE FOR CARRYING OUT THE INVENTION

In the following, embodiments for carrying out a radio receiver of the present invention will be described with reference to the drawings. Note that in processing flows described below, a single frequency step during a search is set at 200 kHz.

First Embodiment

Figure 1:
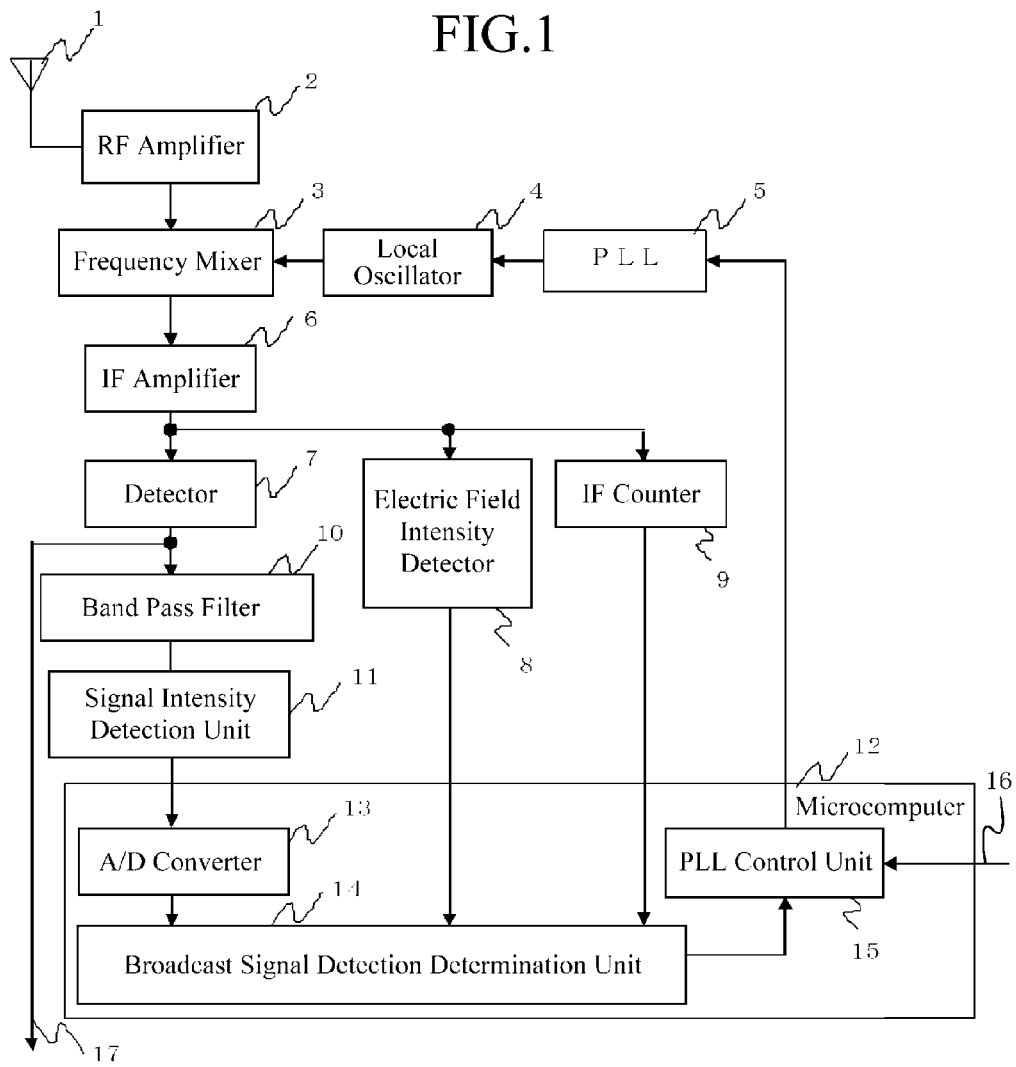
FIG. 1 is a block diagram showing a configuration of a radio receiver in a first embodiment of the present invention.

FIG. 1 is a block diagram showing a configuration of a radio receiver in a first embodiment of the present invention.

As shown in FIG. 1, the radio receiver in the first embodiment is composed of an antenna 1, an RF amplifier 2, a frequency mixer 3, a local oscillator 4, a PLL 5, an IF amplifier 6, a detector 7, an electric field intensity detector 8, an IF counter 9, a band pass filter 10, a signal intensity detection unit 11, a microcomputer 12, an A/D converter 13, a broadcast signal detection determination unit 14, and a PLL control unit 15.

The antenna 1 receives a broadcast signal and outputs a received signal. The RF amplifier 2 amplifies the received signal from the antenna 1.

The frequency mixer 3 converts the received signal into an IF signal by mixing the received signal amplified by the RF amplifier 2 with a high-frequency signal for frequency conversion generated by the local oscillator 4.

The local oscillator 4 generates the high-frequency signal for frequency conversion, and outputs the resultant signal to the frequency mixer 3. The PLL 5 controls an oscillation frequency of the local oscillator 4 on the basis of an N value set by the PLL controller 15. Further, the PLL control unit 15 sets the N value in the PLL 5 in accordance with an external tuning instruction 16.

The IF amplifier 6 amplifies the IF signal generated by the frequency mixer 3. The detector 7 detects the IF signal amplified by the IF amplifier 6 in analog form and outputs the detected signal. The detected signal is also output to an audio processing circuit (not shown) by an output line 17 to serve as an audio output of the receiver, and is subjected to noise detection as described below to be used as a determination material in the broadcast signal detection determination unit 14.

The electric field intensity detector 8 detects an electric field intensity of the IF signal amplified by the IF amplifier 6. The IF counter 9 counts a frequency of the IF signal amplified by the IF amplifier 6. The counted frequency is used as a determination material in the broadcast signal detection determination unit 14.

Figure 2:
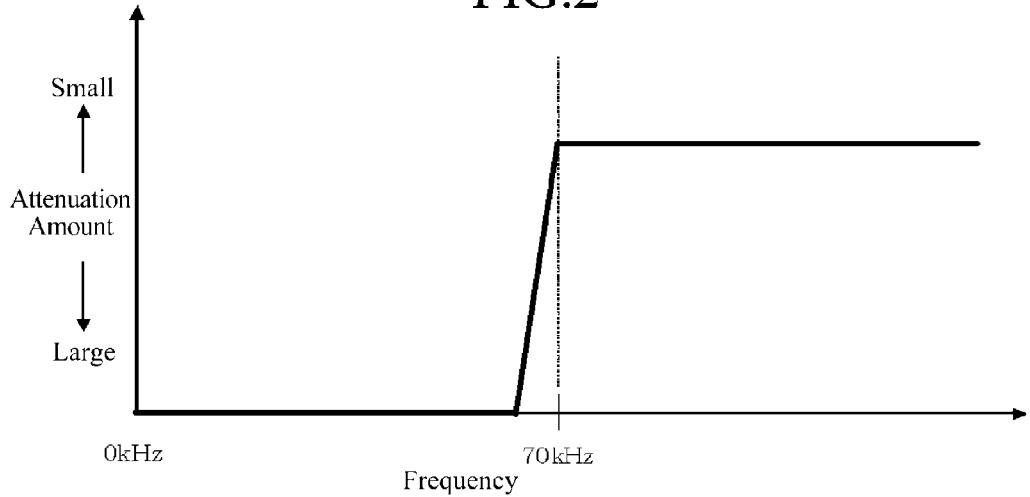
FIG. 2 is a view showing one example of a characteristic of a band pass filter provided in the radio receiver shown in FIG. 1.

The band pass filter 10 passes a signal in a certain specific frequency band from among the detection signals generated by the detector 7, as shown in FIG. 2, to thus detect noise included in the signal. In the present invention, the band pass filter 10 is set to pass frequencies of 70 kHz or higher. Thus, noise that is a harmonic component of a digital signal existing in a band of 70 kHz or higher in a digital broadcast signal is passed through the band pass filter 10.

The signal intensity detection unit 11 converts the extracted noise into a direct current. A direct-current-converted signal is then converted into a digital signal by the A/D converter 13 provided in the microcomputer 12. The digitized signal is used as a determination material in the broadcast signal detection determination unit 14.

When making a search, the broadcast signal detection determination unit 14 determines whether or not a signal having a broadcast frequency of a desired station is being received on the basis of the electric field intensity detected by the electric field intensity detector 8, the frequency detected by the IF counter 9, and the digital signal converted by the A/D converter 13.

Next, an operation of the radio receiver in the first embodiment will be described.

When the antenna 1 receives the broadcast signal, it outputs the received signal to the RF amplifier 2. The RF amplifier 2 amplifies the received signal and outputs the amplified signal to the frequency mixer 3.

Then, the frequency mixer 3 converts the amplified received signal into an IF signal by mixing the amplified received signal with the high-frequency signal from the local oscillator 4, and outputs the IF signal to the IF amplifier 6. The IF amplifier 6 amplifies the IF signal generated by the frequency mixer 3, and outputs the resultant signal to the detector 7, the electric field intensity detector 8, and the IF counter 9. Then, the electric field intensity detector 8 detects the electric field intensity of the IF signal, and the IF counter 9 counts the frequency of the IF signal.

Then, the detector 7 detects the IF signal in analog form and outputs the detected signal to the band pass filter 10. The band pass filter 10 detects noise by passing a signal in a certain specific frequency band from among the detected signals generated by the detector 7. As shown in FIG. 2, in a band extending to 70 kHz among detected signals of an HD radio broadcast, a stereo audio signal and an RBDS (Radio Broadcast Data System) signal exist in an analog broadcast signal, while a digital signal such as a digital audio signal, and noise that is a harmonic component of the digital signal exist in a digital broadcast signal. A pass frequency band of the band pass filter 10 is set such that frequencies of 70 kHz or higher are passed, and therefore noise that is a harmonic component of a digital signal existing at a high level in a band of 70 kHz or higher in the digital broadcast signal is passed therethrough.

The signal intensity detection unit 11 converts the noise extracted by the band pass filter 10 into a direct current. The direct current-converted signal is converted into a digital signal by the A/D converter 13 provided in the microcomputer 12. An envelope detection circuit, for example, a circuit that performs half-wave rectification using a diode and smoothing using a capacitor, may be used as the signal intensity detection unit 11.

Figure 3:
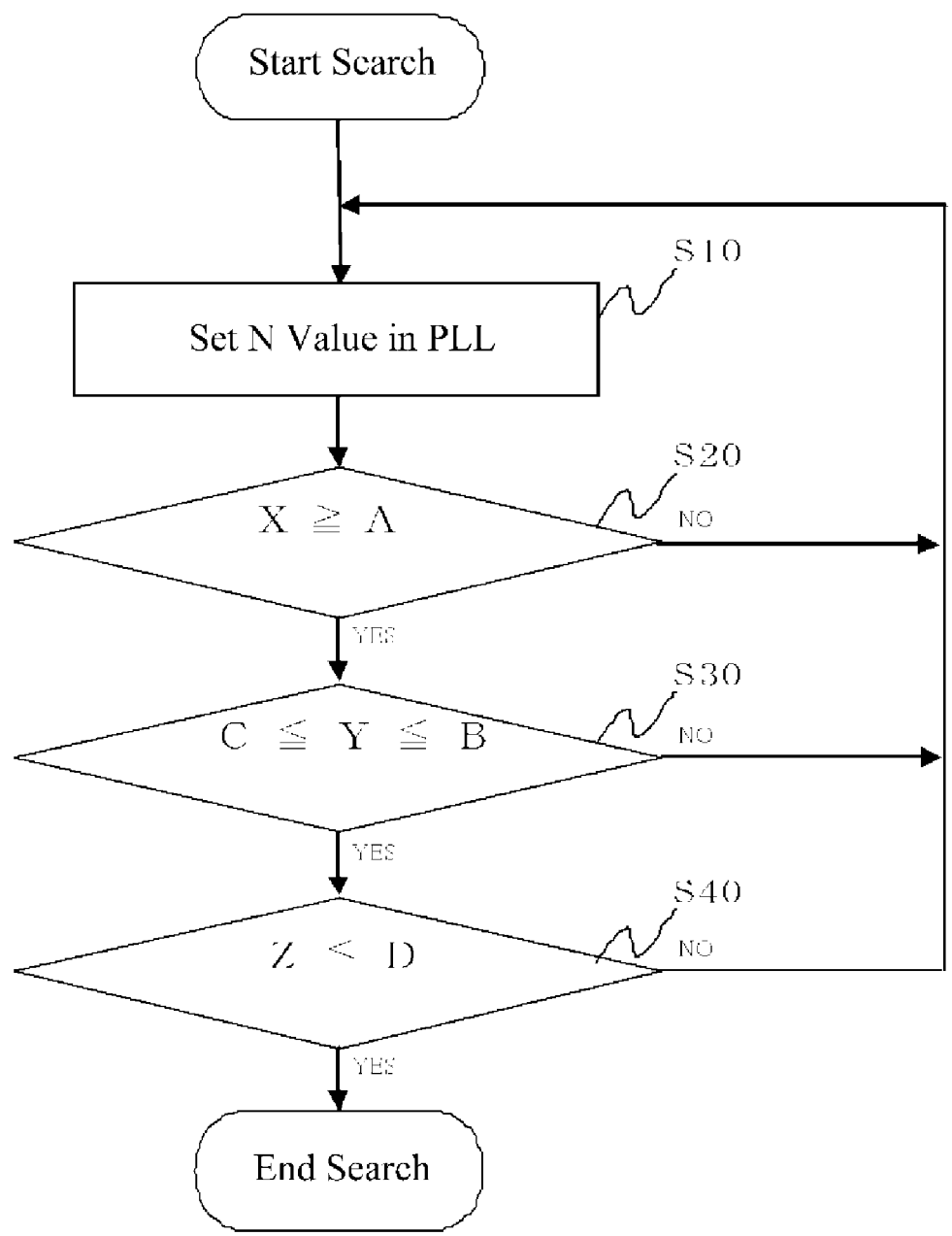
FIG. 3 is a flowchart showing a search procedure in the radio receiver shown in FIG. 1.

A case in which a search for a desired station is made will now be described with reference to FIG. 3. FIG. 3 is a flowchart showing a search procedure executed in the radio receiver shown in FIG. 1.

In Step S10, the PLL control unit 15 sets the N value in the PLL 5 on the basis of the external tuning instruction 16. Then, when, for example, an upward search is made from an initially set reception frequency, the PLL 5 sets a control signal in the local oscillator 4 on the basis of the N value from the PLL control unit 15 to thus change the oscillation frequency of the local oscillator 4, so that a signal of the next frequency step from the frequency of the signal under reception is received. For example, when a broadcast signal of 98.1 MHz is under reception, the next frequency is 98.3 MHz.

Then, in a condition receiving a broadcast signal of 98.1 MHz, the broadcast signal detection determination unit 14 reads the output of the electric field intensity detector 8 in Step S20 and determines whether or not an electric field intensity X of the IF signal detected by the electric field intensity detector 8 is equal to or greater than a predetermined threshold value A. When "X≧A" is established (Step S20:

YES), the routine advances to Step S30, while when "X≧A" is not established (Step S20: NO), the routine returns to Step S10, and a broadcast signal of the next frequency 98.3 MHz is received; the processings from Step S10 onward are repeated.

Next, in Step S30, the broadcast signal detection determination unit 14 reads the output of the IF counter 9 and determines whether or not a frequency Y of the IF signal, detected by the IF counter 9, is within a predetermined range (between B and C). A range of ±25 kHz centering on a reference frequency 10.7 MHz of the IF signal, for example, is set as the predetermined range. In this case, B is 10.7 MHz+25 kHz and C is 10.7 MHz−25 kHz. When "B≧Y≧C" is established (Step S30: YES), the routine advances to Step S40. When "B≧Y≧C" is not established (Step S30: NO), the routine returns to the step S10, and a broadcast signal of the next frequency 98.3 MHz is received; the processings from Step S10 onward are repeated.

Then, in Step S40, the broadcast signal detection determination unit 14 reads the output of the A/D converter 13 and determines whether or not the signal detected by the A/D converter 13 is at or below a predetermined value Z. When "Z≦D" is established (Step S40: YES), the broadcast signal detection determination unit 14 determines that the desired broadcast signal is included in the received signal and then stops the search. When "Z≦D" is not established (Step S40: NO), the routine returns to Step S10, and a broadcast signal of the next frequency 98.3 MHz is received; the processings from Step S10 onward are repeated.

As described above, according to the first embodiment, the determination as to whether or not the desired broadcast signal is being received is made on the basis of the signal value of the signal detected by the A/D converter 13 in addition to the outputs of the electric field intensity detector 8 and the IF counter 9; thus, noise existing at a high level in a certain specific frequency band of the digital broadcast signal is detected, and when the noise exceeds a certain fixed value, the corresponding signal is eliminated from stopping subjects of the search, so that erroneous stoppages in an HD radio digital broadcast band are prevented. When noise existing at a high level in a certain specific frequency band included in the detected signal of the broadcast signal is detected, an analog broadcast signal or a digital broadcast signal is determined, and therefore, the broadcast signal can be identified accurately.

In the first embodiment discussed above, a single frequency step during the search is set at 200 kHz, but the single frequency step is not limited to 200 kHz.

Second Embodiment

Figure 4:
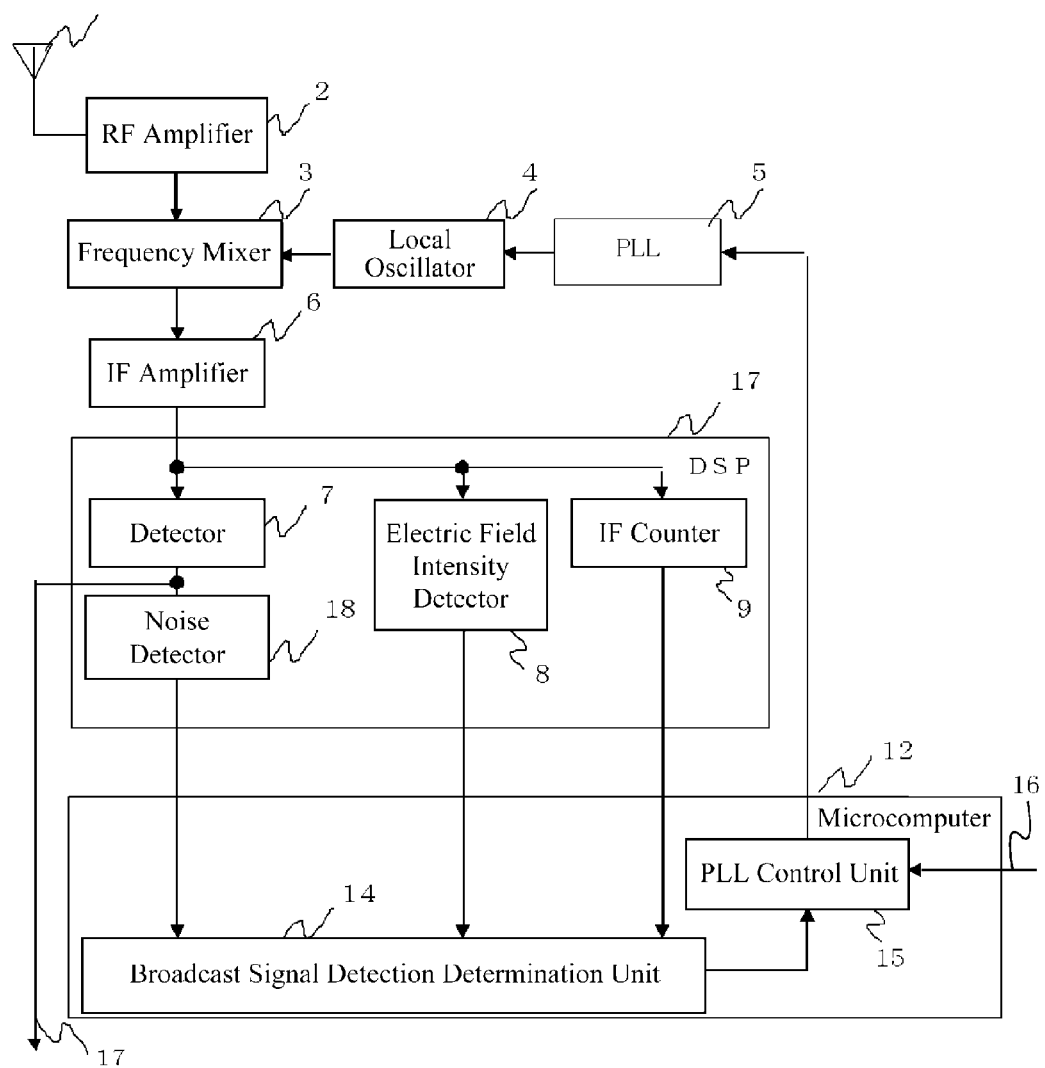
FIG. 4 is a block diagram showing a configuration of a radio receiver in a second embodiment of the invention.

FIG. 4 is a block diagram showing a configuration of a radio receiver in a second embodiment of the present invention. Note that redundant parts with the radio receiver in the first embodiment shown in FIG. 1 are allocated by identical reference numerals, and redundant descriptions thereof will be omitted.

As shown in FIG. 4, the radio receiver in the second embodiment is configured to achieve a noise detection method by using a function of a DSP (Digital Signal Processor). The radio receiver is composed of an antenna 1, an RF amplifier 2, a frequency mixer 3, a local oscillator 4, a PLL 5, an IF amplifier 6, a detector 7, an electric field intensity detector 8, an IF counter 9, a microcomputer 12, a broadcast signal detection determination unit 14, a PLL control unit 15, a DSP 17, and a noise detector 18.

The noise detector 18 detects noise from the detected signal generated by the detector 7. The detected signal is used as a determination material in the broadcast signal detection determination unit 14. As shown in FIG. 2, in a band extending to 70 kHz among detected signals of an HD radio broadcast, a stereo audio signal and an RBDS (Radio Broadcast Data System) signal exist in an analog broadcast signal while a digital signal such as a digital audio signal exists in a digital broadcast signal. A determination frequency of the noise detector 18 is set to detect a frequency band of 70 kHz or higher in which noise that is a harmonic component of the digital signal in the digital broadcast signal exists at a high level.

When making a search, the broadcast signal detection determination unit 14 determines whether or not a signal having the broadcast frequency of the desired station is being received on the basis of the electric field intensity detected by the electric field intensity detector 8, the frequency detected by the IF counter 9, and the signal detected by the noise detector 18.

Next, an operation of the radio receiver in the second embodiment will be described.

The detector 7 detects the IF signal and outputs the detected signal to the noise detector 18. Similarly to the first embodiment, the detected signal is output to an audio processing circuit (not shown) over the output line 17 to serve as an audio output of the receiver. The noise detector 18 detects a signal level of noise in a specific frequency band from among the detected signals generated by the detector 7.

A case in which a search for a desired station is made will now be described with reference to FIG. 3.

In Step S10, the PLL control unit 15 sets an N value in the PLL 5 on the basis of the external tuning instruction 16. Then, when, for example, an upward search is performed from the initially set reception frequency, the PLL 5 sets a control signal in the local oscillator 4 on the basis of the N value from the PLL control unit 15 to thus change the oscillation frequency of the local oscillator 4, so that a signal of the next frequency step from the frequency of the signal under reception is received. For example, when a broadcast signal of 98.1 MHz is under reception, the next frequency is 98.3 MHz.

Then, in a condition receiving a broadcast signal of 98.1 MHz, the broadcast signal detection determination unit 14 reads the output of the electric field intensity detector 8 in Step S20 and determines whether or not the electric field intensity X of the IF signal detected by the electric field intensity detector 8 is equal to or greater than the predetermined threshold value A. When "X≧A" is established (Step S20: YES), the routine advances to Step S30, while when "X≧A" is not established (Step S20: NO), the routine returns to Step S10, and a broadcast signal of the next frequency 98.3 MHz is received; the processings from Step S10 onward are repeated.

Next, in Step S30, the broadcast signal detection determination unit 14 reads the output of the IF counter 9 and determines whether or not the frequency Y of the IF signal, detected by the IF counter 9, is within the predetermined range (between B and C). A range of ±25 kHz centering on the reference frequency 10.7 MHz of the IF signal, for example, is set as the predetermined range. In this case, B is 10.7 MHz+25 kHz and C is 10.7 MHz−25 kHz. When "B≧Y≧C" is established (Step S30: YES), the routine advances to Step S40. When "B≧Y≧C" is not established (Step S30: NO), the routine returns to the step S10, and a broadcast signal of the next frequency 98.3 MHz is received; the processings from Step S10 onward are repeated.

Next, in Step S40, the broadcast signal detection determination unit 14 reads the output of the noise detector 18 and determines whether or not the signal detected by the noise detector 18 is at or below the predetermined value Z. When "Z≦D" is established (Step S40: YES), the broadcast signal detection determination unit 14 determines that the desired broadcast signal is included in the received broadcast signal and stops the search. When "Z≦D" is not established (Step S40: NO), the routine returns to Step S10, where a broadcast signal of the next frequency 98.3 MHz is received; the processings from Step S10 onward are repeated.

When the signal detected by the noise detector 18 is at or below an upper limit value, it is determined that a broadcast station under a favorable reception condition is found, and the search is stopped.

As described above, according to the second embodiment, the determination as to whether or not the desired broadcast signal is being received is made on the basis of the signal value of the signal detected by the noise detector 18, in addition to the outputs of the electric field intensity detector 8 and the IF counter 9. Therefore, noise existing in the digital broadcast signal for HD radio is detected, and when the noise exceeds a certain fixed value, the corresponding signal is eliminated from stopping subjects of the search; as a result, erroneous stoppages in an HD radio digital broadcast band are prevented. When noise existing at a high level in a certain specific frequency band included in the detected signal of the broadcast signal is detected, an analog broadcast signal or a digital broadcast signal is determined, and therefore, the broadcast signal can be identified accurately. Furthermore, according to the second embodiment, noise detection is implemented by a DSP, and therefore the band pass filter can be eliminated such that the number of components is smaller than that of the first embodiment.

Third Embodiment

Figure 5:
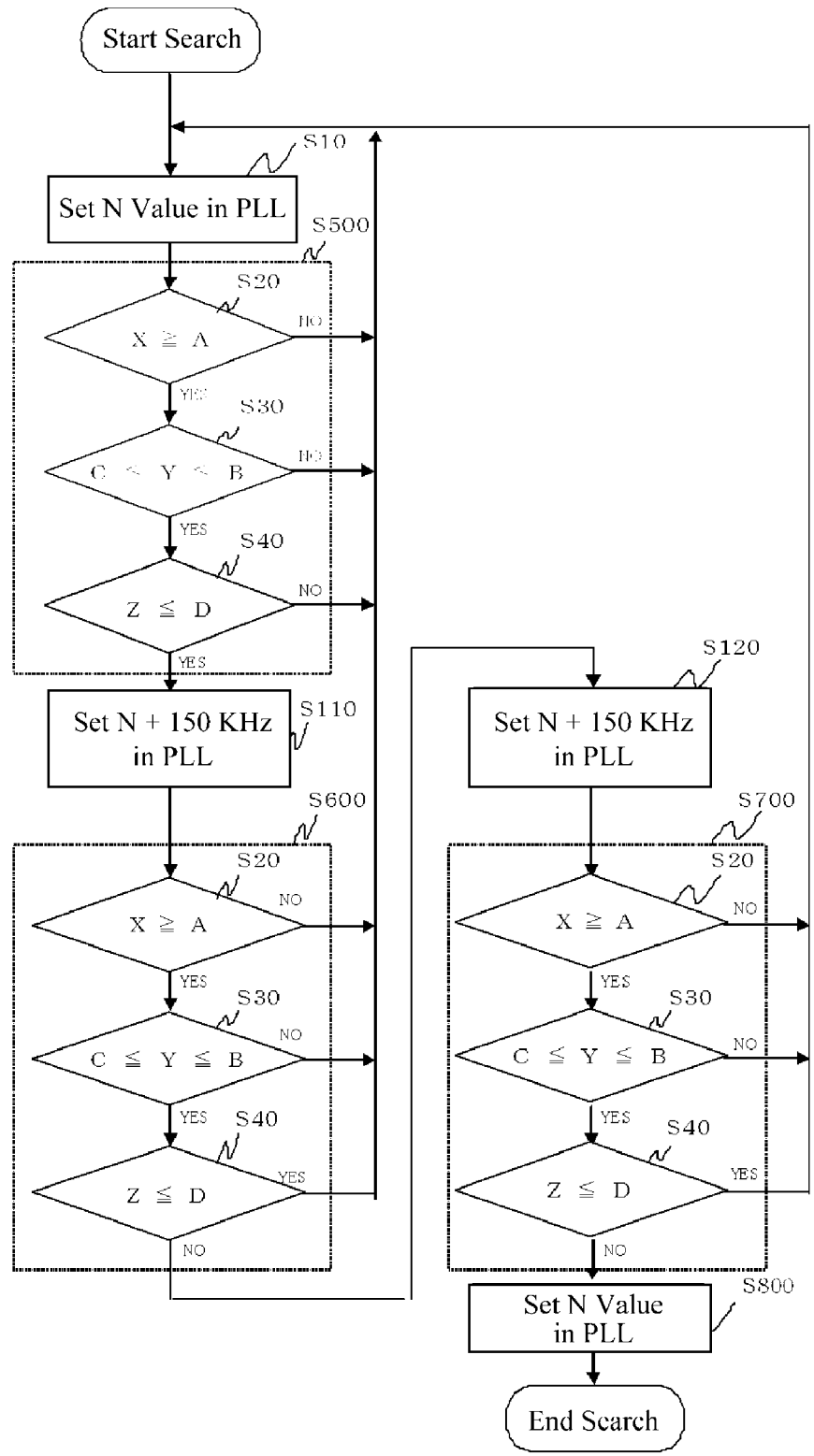
FIG. 5 is a view showing a flowchart in a third embodiment of the invention.
Figure 6:
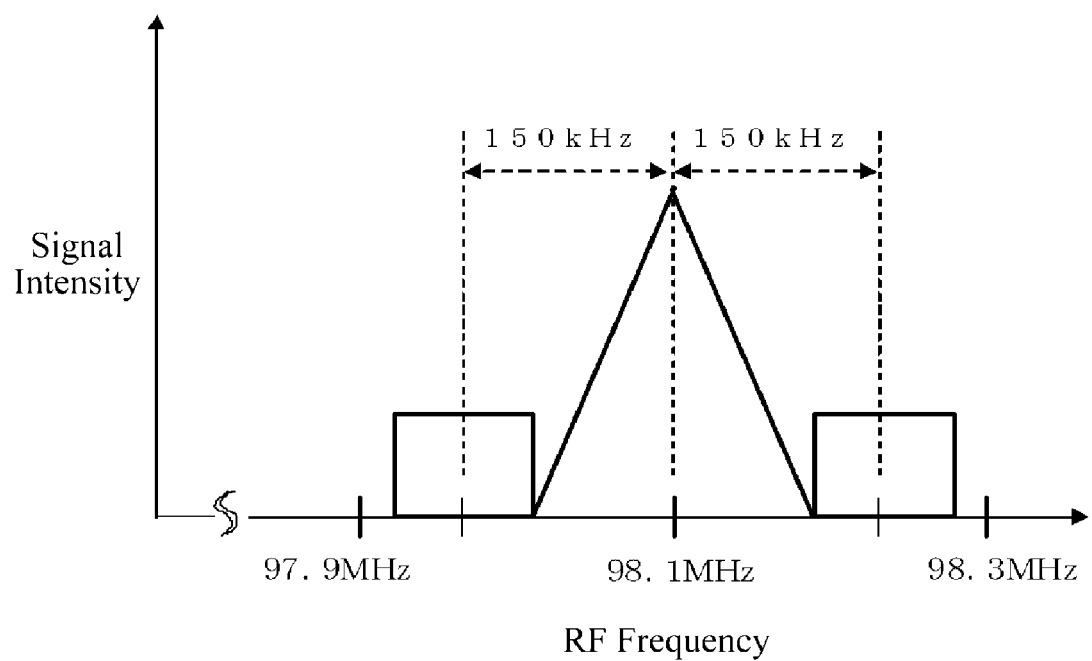
FIG. 6 is a schematic view showing a spectrum of a broadcast signal for an HD radio broadcast.

Further, FIG. 5 shows a flowchart in a third embodiment as an application of an invention employing a noise detection unit, such that an HD radio compatible broadcast station can be found quickly.

First, similarly to FIG. 3, an N value is set in a PLL to make a search for an analog broadcast station, and then checks are performed to determine whether or not an electric field intensity equals or exceeds a search stopping level, an IF count is within the range, and noise is no greater than an upper limit value (Step S500). When affirmative results are obtained from the checks, this means that an analog broadcast signal is found, and the routine advances to Step S600. However, when an analog broadcast signal is not found, the search is continued until the N value is found.

Next, the PLL is set at (N+150 kHz) (Step S600). Determinations are then made as to whether or not the electric field intensity equals or exceeds the search stopping level, the IF count is within the range, and the noise is no greater than the upper limit value. When the electric field intensity equals or exceeds the search stopping level and the IF count is within the range but the noise exceeds the upper limit value, it is determined that the presence of a digital signal is affirmative.

Finally, the PLL is set at (N−150 kHz) (Step S700); determinations are made as to whether or not the electric field intensity equals or exceeds the search stopping level, the IF count is within the range, and the noise is no greater than the upper limit value. When the electric field intensity equals or exceeds the search stopping level and the IF count is within the range but the noise exceeds the upper limit value, it is determined that the presence of a digital signal is affirmative; as a result, it is determined that an HD radio compatible broadcast station is found. The PLL is then returned to the initially set N value (Step S800).

When it is determined in Step S600 or Step S700 that the noise is no greater than the upper limit value, this means that no digital broadcast signal exists within ±150 kHz of the center frequency, and it is therefore determined that no HD radio compatible broadcast station is found. Accordingly, the routine returns to Step S10, where the next frequency is set in the PLL as the N value, and the next analog broadcast signal is checked (Step S500).

According to the above method, it can be confirmed that an analog broadcast signal is at the center frequency and a digital broadcast signal is within ±150 kHz thereof, and therefore a frequency at which an HD radio compatible broadcast station is highly likely to exist can be detected before obtaining the information relating to the digital broadcast signal.

INDUSTRIAL APPLICABILITY

The present invention can be used in a search operation executed in a receiver of a radio that performs digital audio broadcasting using an analog radio frequency band such as an existing FM broadcast and in an analog FM radio receiver.

EXPLANATION OF REFERENCE NUMERALS

2 RF amplifier
3 frequency mixer
6 IF amplifier
7 detector
8 electric field intensity detector
9 IF counter
10 band pass filter
11 signal intensity detection unit
12 microcomputer
14 broadcast signal detection determination unit
15 PLL control unit
17 DSP
18 noise detector

The invention claimed is:

1. A radio receiver comprising:
an RF amplifier that receives a broadcast signal and generates an RF signal;
an IF conversion unit that generates an IF signal from the RF signal;
an electric field intensity detector that detects an electric field intensity of the IF signal;
a frequency detection unit that detects a frequency of the IF signal;
a detector that detects the IF signal and generates a detected signal;
a noise signal detection unit that detects an intensity of a noise signal that is a harmonic component of a digital signal that exists in a certain specific frequency band from among the detected signals generated by the detector;
a broadcast signal detection determination unit that determines that the broadcast signal includes a desired analog broadcast signal when the electric field intensity detected by the electric field intensity detector is equal to or larger than a predetermined electric field intensity, the frequency detected by the frequency detection unit is within a predetermined frequency range, and the intensity of the noise signal detected by the noise signal detection unit is equal to or smaller than a predetermined value; and
a control unit that performs a control to stop a search of the broadcast signal on the basis of the determination made by the broadcast signal detection determination unit.

2. The radio receiver according to claim 1, wherein the noise signal detection unit includes: a band pass filter that passes a signal existing in a certain specific frequency band from among the detected signals; and a signal intensity detection unit that detects an intensity of the signal passed through the band pass filter.

* * * * *

UNITED STATES PATENT AND TRADEMARK OFFICE
CERTIFICATE OF CORRECTION

PATENT NO. : 8,364,073 B2
APPLICATION NO. : 13/375777
DATED : January 29, 2013
INVENTOR(S) : Takashi Senoo It is certified that error appears in the above-identified patent and that said Letters Patent is hereby corrected as shown below:

ON THE TITLE PAGE:

At item (73), Assignee, change:

"(73)   Assignee:   Mitsubishi Electric Corp., Tokyo (JP)"

to

--(73)   Assignee:   Mitsubishi Electric Corporation, Tokyo (JP)--.

Signed and Sealed this
Thirtieth Day of April, 2013

Teresa Stanek Rea
*Acting Director of the United States Patent and Trademark Office*